United States Patent [19]
Kim et al.

[11] Patent Number: 6,122,220
[45] Date of Patent: Sep. 19, 2000

[54] CIRCUITS AND METHODS FOR GENERATING INTERNAL SIGNALS FOR INTEGRATED CIRCUITS BY DYNAMIC INVERSION AND RESETTING

[75] Inventors: Byoung-Ju Kim; Hi-Choon Lee, both of Kyunggi-do, Rep. of Korea

[73] Assignee: Samsung Electronics Co., Ltd., Rep. of Korea

[21] Appl. No.: 09/396,870

[22] Filed: Sep. 15, 1999

[30] Foreign Application Priority Data

Sep. 18, 1998 [KR] Rep. of Korea ............ 98-38789

[51] Int. Cl.[7] .................. G11C 7/00; G11C 8/00
[52] U.S. Cl. ............ 365/233; 365/233.5; 365/230.06; 365/194; 327/261
[58] Field of Search ............ 365/230.01, 189.01, 365/233, 233.5, 194; 327/261

[56] References Cited

U.S. PATENT DOCUMENTS

| | | | |
|---|---|---|---|
| 5,813,023 | 9/1998 | McLaury | 711/105 |
| 5,815,462 | 9/1998 | Konishi et al. | 365/233 |
| 5,892,730 | 4/1999 | Sato et al. | 365/233 |
| 5,923,613 | 7/1999 | Tien et al. | 365/233 |
| 5,946,244 | 8/1999 | Manning | 365/194 |
| 5,995,441 | 11/1999 | Kato et al. | 365/233 |
| 6,026,045 | 2/2000 | Son | 365/230.03 |
| 6,044,023 | 3/2000 | Proebsting | 365/189.01 |

*Primary Examiner*—Viet Q. Nguyen
*Attorney, Agent, or Firm*—Myers Bigel Sibley & Sajovec

[57] ABSTRACT

Internal signals for integrated circuits are generated by a reset circuit that is responsive to an input signal to generate a reset signal pulse a predetermined time after the input signal is activated, and a dynamic inversion circuit that inverts the input signal in the absence of the reset signal pulse and that assumes an inactive state in response to the reset signal pulse, to thereby produce an output pulse that is activated by the input signal and that is deactivated by the reset circuit as a function of the predetermined time. Methods of operating integrated circuits generate a reset signal pulse a predetermined time after an input signal is activated. The input signal is inverted until the reset pulse is generated, to thereby produce an output pulse that is activated by the input signal and that is deactivated by the reset circuit as a function of the predetermined time. Accordingly, circuits and methods for generating internal clock signals for integrated circuits by dynamic inversion and resetting can rapidly generate internal clock signals from external clock signals and can have reduced susceptibility to noise.

27 Claims, 6 Drawing Sheets

CIRCUITS AND METHODS FOR GENERATING INTERNAL SIGNALS FOR INTEGRATED CIRCUITS BY DYNAMIC INVERSION AND RESETTING

FIELD OF THE INVENTION

This invention relates to integrated circuits and operating methods therefor, and more particularly to circuits and methods for generating internal signals for integrated circuits.

BACKGROUND OF THE INVENTION

Integrated circuits are widely used for consumer and commercial applications. One widely used class of integrated circuits are integrated circuit memory devices, including Dynamic Random Access Memory (DRAM) devices and Static Random Access Memory (SRAM) devices.

Synchronous integrated circuit memory devices have been developed that can be synchronized with the clock speed of a processor. By using synchronous memory devices, the operational speed of a data processing system can be increased. Synchronous memory devices can include synchronous DRAMs (SDRAMs) or synchronous SRAMs (SSRAMs). The present application will be described with respect to an SDRAM. However, as will be described below, the present invention may be used with SSRAMS or other integrated circuits.

FIG. 1 is a block diagram of a conventional SDRAM device. As shown in FIG. 1, the SDRAM device 1 includes a memory cell array 10 that includes a plurality of bit lines, a plurality of word lines and a plurality of DRAM cells at intersections of the word lines and the bit lines. A row decoder circuit 14 selects the word lines in accordance with a row address from an address buffer circuit 12. A column decoder circuit 16 selects bit lines in response to a column address from the address buffer circuit 12.

Data stored in at least one DRAM cell at an intersection of at least one selected word line and at least one selected bit line, is sensed and amplified by a sense amplifier circuit 18. The sensed data is then transferred to a data output buffer circuit 22. In the SDRAM 1, a clock generating circuit 20 also is provided that generates a clock signal CLKDQ to clock the data output buffer circuit 22 in response to an externally applied clock signal XCLK at pad 2. Thus, the data output buffer circuit 22 outputs the data DQ1 through DQ2 to external of the SDRAM via output pads 3 in synchronization with the internal clock signal CLKDQ that is generated by the clock generating circuit 20. Although not shown in FIG. 1, the SDRAM also receives from external of the SDRAM, a row and column address XAi through XA1, data to be written, read/write commands and/or other data in synchronization with the external clock signal XCLK.

As the operating frequency of SDRAMs continues to increase, it may be desirable to provide clock generating circuits and methods that can operate at increasingly higher frequencies. For example, it may be desirable to generate the internal clock signal CLKDQ without the need for significant delay in the clock generating circuit 20. Thus, data may be output rapidly to external of the SDRAM.

FIG. 2 is a detailed circuit diagram of a clock generating circuit 20 of FIG. 1. Referring to FIG. 2, the clock generating circuit 20 includes a differential amplifier circuit 21, an internal buffer circuit 23, two inverters INV3 and INV4, a delay circuit 24, a NAND gate G1, a NOR gate G2 and an output driver circuit 25. Operation of the clock generating circuit 20 of FIG. 2 now will be described with reference to FIG. 3, which is a timing diagram that shows signal waveforms at various nodes of FIG. 2.

Referring to FIGS. 2 and 3, when the external clock signal XCLK remains low (that is, when a reference voltage VREF level is higher than the voltage level of the external clock signal XCLK), the output node N1 of the differential amplifier circuit 21 is at a logic high level. The node N2 transitions to a logic high level via the internal buffer circuit 23, so that the nodes N3, N4 and N5 transition to a logic low level, respectively. This enables the output (that is, the node N6) of the NOR gate G2 to transition to a logic low level. Accordingly, the clock signal CLKDQ from the clock generating circuit 20 remains low. In this example, a logic low level of the external clock signal XCLK having a TTL level may be about 0.4 volts, and a logic high level thereof may be about 2.4 volts. A logic low level of the external clock signal XCLK having a CMOS level may be about 0 volts, and a logic high level thereof may be about 3 volts. Alternatively, for CMOS, the logic high level may be more or less than 3 volts.

As illustrated in FIG. 3, when the external clock signal XCLK transitions from a logic low level to a logic high level, the output node N1 of the differential amplifier circuit 21 transitions to a logic low level. When the node N2 transitions from a logic high level to a logic low level via the internal buffer circuit 23, the node N6 (the output of the NOR gate G2) transitions to a logic high level because all of the inputs N2 and N5 of the NOR gate G2 become low. Therefore, a line 4 that transfers the clock signal CLKDQ to the data output buffer circuit 22 is driven high by means of the output driver circuit 25.

Then, as illustrated in FIG. 3, the node N5 has a low-to-high transition after a delay time that is determined by the inverter INV3 and the delay circuit 24. This forces the output N6 from the NOR gate G2 to transition to a logic low level regardless of the logic level of the other input of the NOR gate G2. Accordingly, the clock signal CLKDQ transitions from a logic high level to a logic low level. As illustrated in FIG. 3, the clock signal CLKDQ has a pulse width corresponding to the delay time $t_D$ which is determined by inverters INV3 and INV4, the delay circuit 24, and the gates G1 and G2.

At the high-to-low transition of the external clock signal XCLK, the nodes N1 and N2 transition to a logic high level and the nodes N3, N4, N5 turn to a logic low level as was described above. During subsequent clock cycles, the operation of the clock generating circuit 20 is identical to that described above.

The clock signal CLKDQ having a pulse width which corresponds to delay time $t_D$ automatically is generated whenever the external clock signal XCLK transitions from a logic low level to a logic high level. Unfortunately, the clock generating circuit 20 illustrated in FIG. 2 may not be desirable for high-speed synchronous memory devices (for example, SDRAM devices) because of the use of the internal buffer circuit 23. In particular, the time to generate the clock signal CLKDQ may be delayed relative to XCLK, by the delay of the internal buffer circuit 23, compared with the case where the internal buffer circuit 23 is not used.

However, if the internal buffer circuit 23 is not implemented in the clock generating circuit 20 in order to speed up the activation of the clock signal CLKDQ, the node N1 is directly connected to pull-up and pull-down transistors of the NOR gate G2. This may turn on the pull-up and pull-down transistors of the gate G2 due to the unstable level on the node N1 caused by the external clock signal XCLK. Stated differently, the voltage change slope on the node N1 may not be sharp, so that the current consumption of the NOR gate G2 may increase.

More specifically, the size of the respective elements of the differential amplifier circuit 21 may be reduced in order to reduce the current consumption. When the NOR gate G2 having a relatively large gate loading is directly biased by a voltage level on the node N1, the voltage from the NOR gate G2 may change less sharply. This may cause a delay in the activation of the clock signal CLKDQ. Therefore, in order to reduce the current consumption of the NOR gate G2 and to reduce the activation delay of the clock signal CLKDQ, the internal buffer circuit 23 generally is provided in the clock generating circuit 20 of a conventional synchronous memory device. The internal buffer circuit may add its own delay, as was described above.

Finally, the clock generating circuit 20 may be susceptible to noise, for example, ground line bounce. In particular, since the potential on the node N1 changes following the external clock signal XCLK, the level change slope of the node N1 may not be sharp. This may decrease the gate-to-source voltage of a pull-down transistor of the inverter INV1 during the low-to-high transition of the node N1. As a result, the clock generating circuit 20 may be susceptible to ground line bounce.

SUMMARY OF THE INVENTION

It is therefore an object of the present invention to provide improved circuits and methods for generating internal signals for integrated circuits.

It is another object of the invention to provide circuits and methods for generating internal clock signals for integrated circuits.

It is yet another object of the present invention to provide circuits and methods that can rapidly generate internal clock signals for synchronous integrated circuit devices.

It is still another object of the present invention to provide circuits and methods that can generate internal clock signals for synchronous integrated circuit devices and that also can reduce susceptibility to noise.

These and other objects can be provided in integrated circuits, according to the present invention, by a reset circuit that is responsive to an input signal to generate a reset signal pulse a predetermined time after the input signal is activated, and a dynamic inversion circuit that inverts the input signal in the absence of the reset signal pulse and that resets in response to the reset signal pulse, to thereby produce an output pulse that is activated by the input signal and that is deactivated by the reset circuit as a function of the predetermined time. Since the integrated circuit does not need an internal buffer circuit, the delay in producing the output pulse may be reduced. Moreover, since the dynamic inversion circuit may be maintained in the reset or deactivated state in response to the reset pulse, noise immunity can be improved.

The present invention can provide an internal clock generating circuit for an integrated circuit memory device. In particular, an integrated circuit memory device includes a memory cell array comprising a plurality of rows and columns of memory cells. It will be understood that the terms row and column are used to indicate two relative directions rather than absolute orientations. A row decoder selects at least one row of the memory cell array and a column decoder selects at least one column of the memory cell array. A sense amplifier senses data that is stored in the at least one row and the at least one column that are selected. An internal clock generating circuit generates an internal clock pulse in response to an external clock signal. A data output circuit outputs the sensed data to external of the integrated circuit in response to the internal clock signal. The internal clock generating circuit comprises a reset circuit that is responsive to the external clock signal to generate a reset signal pulse a predetermined time after the external clock signal is activated, and a dynamic inversion circuit that inverts the external clock signal in the absence of the reset signal pulse and that resets in response to the reset signal pulse, to thereby produce an internal clock pulse that is activated by the input signal, and that is deactivated by the reset circuit as a function of the predetermined time.

In a preferred embodiment, the dynamic inversion circuit comprises first, second and third field effect transistors, the sources and drains of which are serially connected. The gates of the first and third field effect transistors are responsive to the reset signal pulse and the gate of the second field effect transistor is responsive to the input signal.

The reset circuit preferably comprises an inverter that is responsive to the input signal. A delay circuit also is responsive to the input signal, to delay the input signal by the predetermined time. A logic circuit is responsive to the inverter and to the delay circuit to generate the reset pulse, the predetermined time after the input signal is activated. The delay circuit preferably comprises an odd number of serially connected inverters. The logic circuit preferably comprises a NAND gate that is responsive to the inverter and to the odd number of serially connected inverters, and a second inverter that is responsive to the NAND gate to produce the reset pulse.

The input signal preferably is a function of an external clock signal such that the output pulse provides an internal clock pulse. An input buffer circuit, preferably a differential amplifier circuit, is responsive to an external clock signal to produce the input signal by inverting the external clock signal. A latch also may be provided that is responsive to the output pulse, and an output driver circuit may be provided that is responsive to the latch.

Methods of operating integrated circuits according to the invention generate a reset signal pulse a predetermined time after an input signal is activated. The input signal is inverted until the reset pulse is generated, to thereby produce an output pulse that is activated by the input signal and that is deactivated by the reset circuit as a function of the predetermined time. Accordingly, circuits and methods for generating internal clock signals for integrated circuits by dynamic inversion and resetting can rapidly generate internal clock signals from external clock signals and can have reduced susceptibility to noise.

DETAILED DESCRIPTION OF PREFERRED EMBODIMENTS

Figure 1:
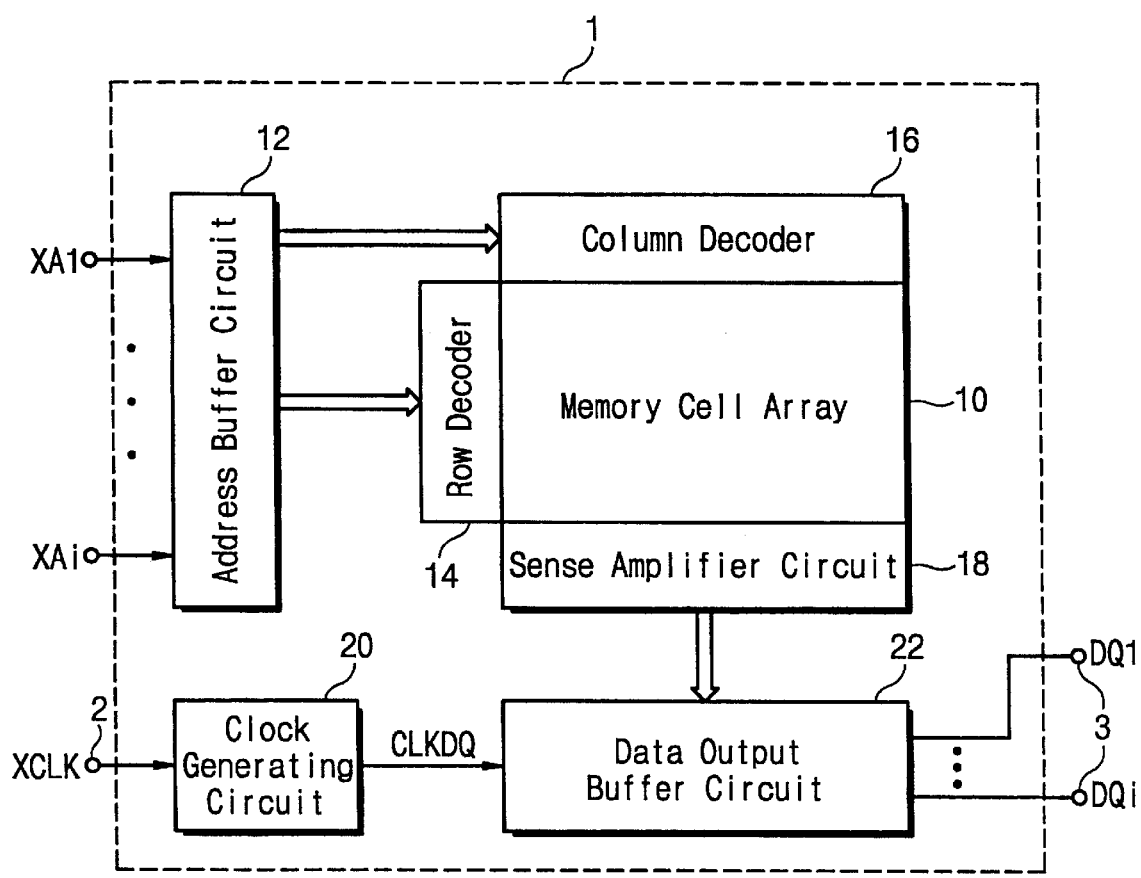
FIG. 1 is a block diagram of a conventional synchronous memory device.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity type embodiment as well.

Figure 4:
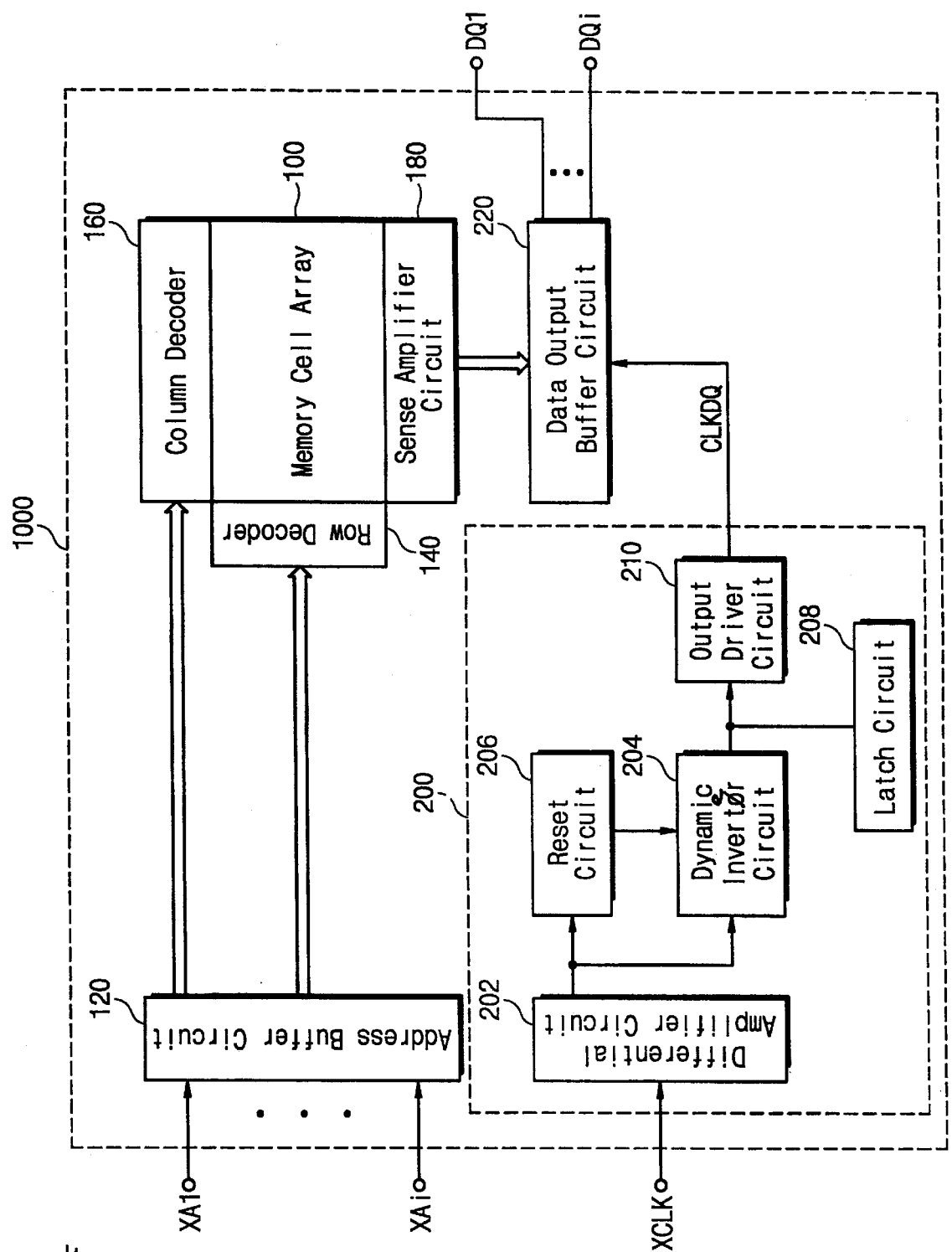
FIG. 4 is a block diagram of an embodiment of synchronous memory devices including circuits and methods for generating internal clock signals according to the present invention.
Figure 5:
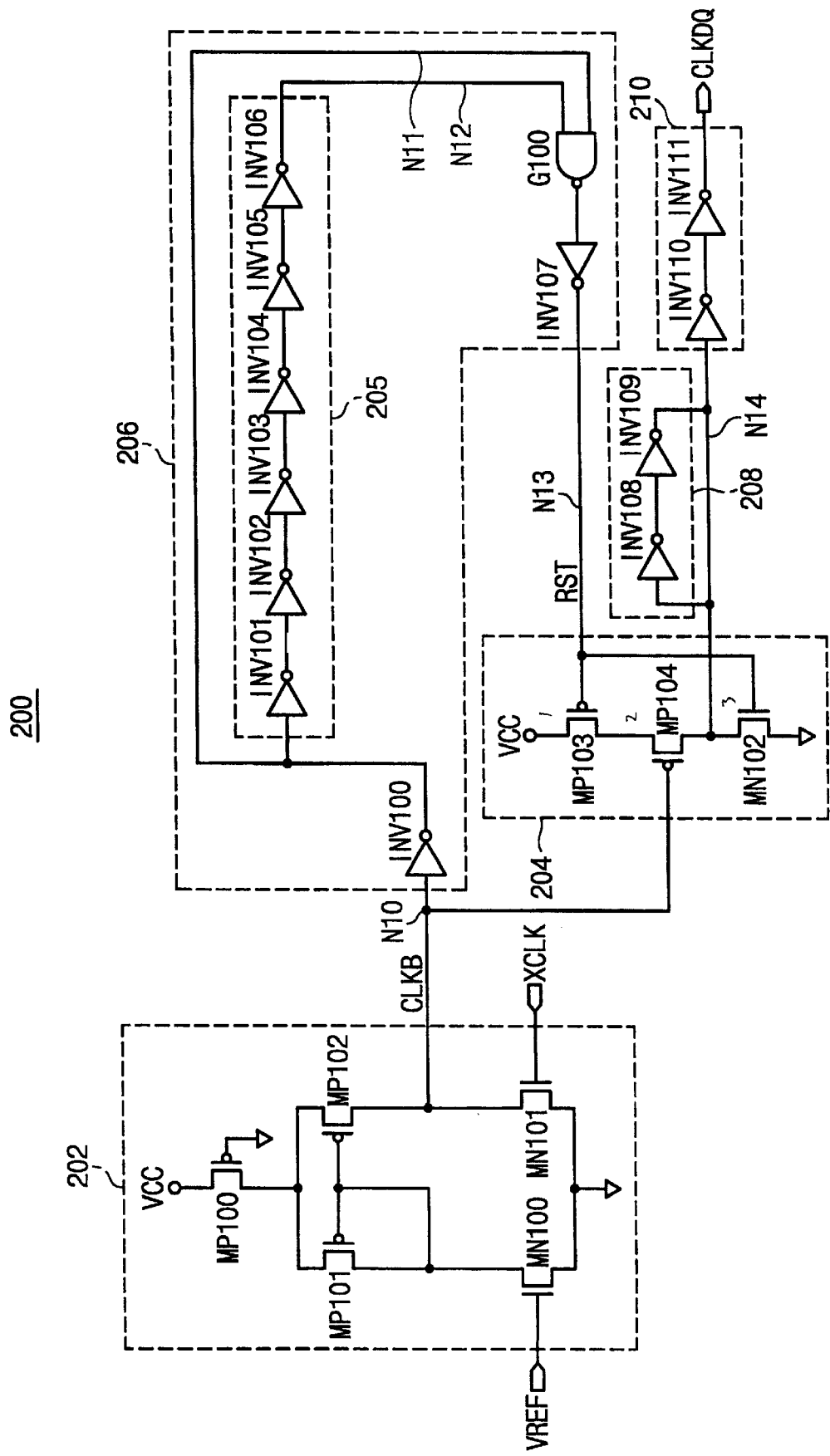
FIG. 5 is a circuit diagram of a preferred embodiment of a clock generating circuit illustrated in FIG. 4.

FIG. 4 is a block diagram of an embodiment of a Synchronous Dynamic Random Access Memory (SDRAM) device including clock generating circuits and methods according to the present invention. FIG. 5 is a circuit diagram of a preferred embodiment of clock generating circuits and methods illustrated in FIG. 4.

In FIG. 4, the SDRAM device 1000 comprises a memory cell array 100, an address buffer circuit 120, a row decoder circuit 140, a column decoder circuit 160, a sense amplifier circuit 180, and a data output buffer circuit 220, which perform the same functions as was described in FIG. 1. Since these elements and their operations are well known to those having skill in the art, they will not be described in detail herein.

As illustrated in FIG. 4, the SDRAM device 1000 further comprises a clock generating circuit 200 which generates a clock signal CLKDQ for the data output buffer circuit 220 in response to an external clock signal XCLK. The clock generating circuit 200 comprises a differential amplifier circuit 202, a dynamic inverter circuit 204 (also referred to as an inversion circuit), a reset circuit 206, a latch circuit 208, and an output driver circuit 210.

Referring now to FIG. 5, the differential amplifier circuit 202 preferably comprises three PMOS transistors MP100, MP101, MP102 and two NMOS transistors MN100 and MN101 connected as illustrated in FIG. 5. The differential amplifier circuit 202 compares a reference voltage VREF level with a voltage level of an external clock signal XCLK of a TTL level, CMOS level or other level, and outputs a signal CLKB at a node N10 (its output terminal) as a comparison result.

The dynamic inverter circuit 204 preferably comprises two PMOS transistors MP103 and MP104 and an NMOS transistor MN102. The sources and drains of the transistors MP103 and MP104 are connected in series between a power supply voltage VCC and a node N14 (the output terminal of the dynamic inverter circuit 204), and the source and drain of the transistor MN102 are connected between the node N14 and a ground voltage. Stated differently, the sources and drains of transistors MP103, MP104 and MN102 are serially connected between first and second reference voltages. The gates of the transistors MP103 and MN102 are connected in common to a signal RST from the reset circuit 206, that is, to a node N13, and the gate of the transistor MP104 is coupled to the node N10.

The reset circuit 206 preferably comprises two inverters INV100 and INV107, a delay circuit 205 having six inverters INV101 to INV106, and one NAND gate G100 connected as illustrated in FIG. 5. The reset circuit 206 generates a reset pulse signal RST of an active high pulse form in response to the signal CLKB from the circuit 202. The latch circuit 208 preferably comprises two inverters INV108 and INV109. Finally, the output driver circuit 210 preferably is connected to the node N14, and preferably includes two inverters INV110 and INV111 connected in series to each other.

Figure 6:
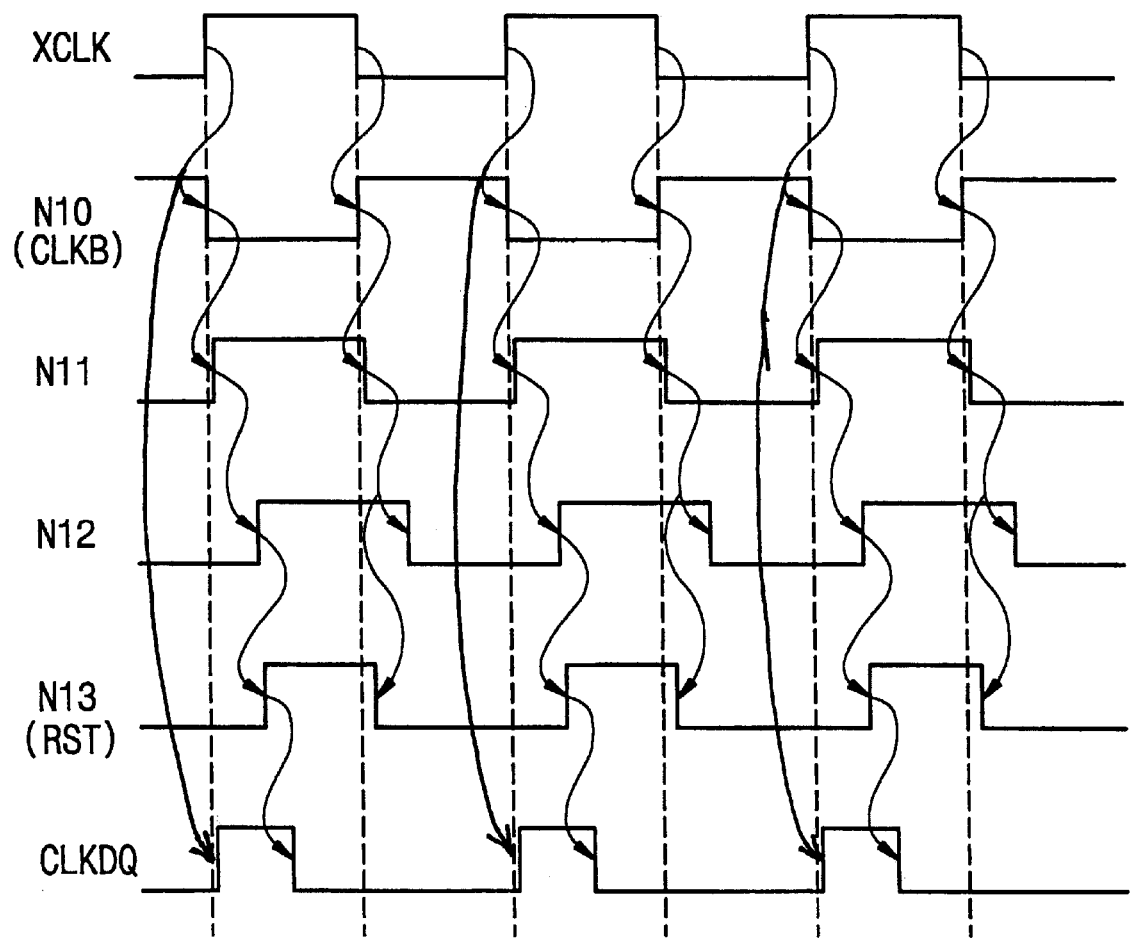
FIG. 6 is a timing diagram showing signal waveforms at various nodes in FIG. 5.

FIG. 6 is a timing diagram showing signal waveforms at various nodes in FIG. 5. The operation of embodiments of clock generating circuits and methods illustrated in FIG. 5 will be described below with reference to FIG. 6.

While the external clock signal XCLK remains low (that is, when the reference voltage VREF is higher than the voltage of the external clock signal XCLK), the signal CLKB from the differential amplifier circuit 202 is high, thereby turning off the PMOS transistor MP104 of the dynamic inverter circuit 204. Furthermore, when the signal CLKB is high, both of the input terminals N11 and N12 of the NAND gate G100 in the reset circuit 206 become low, so that the signal RST from the reset circuit 206 is maintained low. This turns on the PMOS transistor MP103 and turns off the NMOS transistor MN102. Hereinafter, the state of the dynamic inverter circuit 204 as described above will be referred to as a reset state or a standby state.

Then, when the external clock signal XCLK transitions from a logic low level to a logic high level (that is, when the reference voltage VREF is less than the voltage of the external clock signal XCLK), the signal CLKB at the node N10 transitions to a logic low level. This forces the PMOS transistor MP104 of the dynamic inverter circuit 204 to be turned on, so that the node N14 is charged up to a logic high level via the transistors MP103 and MP104. Therefore, the clock signal CLKDQ rapidly transitions from a logic low level to a logic high level via the output driver circuit 210.

At the same time, node N11 of the NAND gate G100 transitions to a logic high level via the inverter INV100. Since the other input terminal N12 thereof remains low, the signal RST continues to be at its previous state, that is, low. After a time elapses which is determined by the inverter N100 and the delay circuit 205, the logic low level on the node N10 is transferred to the other input terminal N12 of the gate G12, so that the signal RST from the circuit 206 transitions from a logic low level to a logic high level. This forces the PMOS transistor MP103 to be turned off and the NMOS transistor MN102 to be turned on. As a result, the clock signal CLKDQ transitions to a logic low level. The logic state of the signal CLKDQ is latched in the latch circuit 208.

Finally, when the external clock signal XCLK transitions to a logic low level, the signal CLKB from the differential amplifier circuit 202 transitions to a logic high level, thereby turning off the PMOS transistor MP104 of the dynamic inverter circuit 204. The signal RST from the reset circuit 206 transitions to a logic low level so as to activate the PMOS transistor MP103 of the dynamic inverter circuit 204 without the delay of the delay circuit 205. Thus, the dynamic inverter circuit 204 is reset such that next clock signal CLKDQ can be generated rapidly at the input of the external clock signal XCLK.

Figure 2:
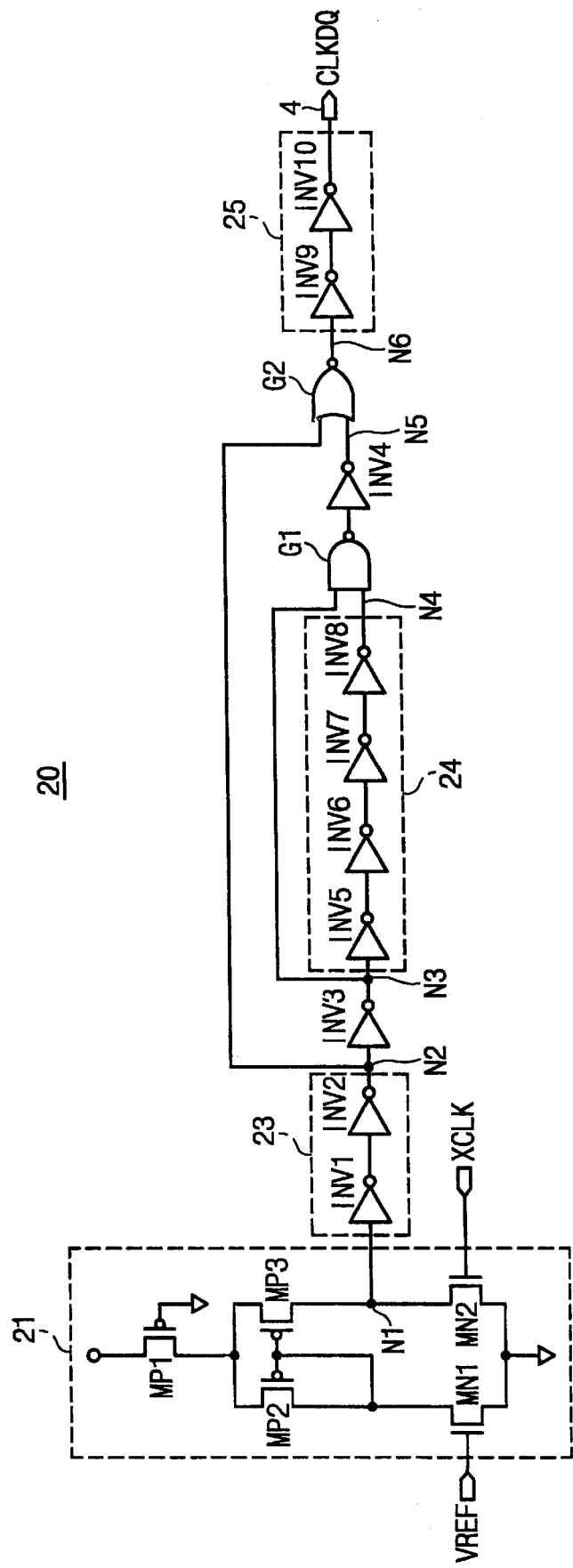
FIG. 2 is a circuit diagram of a clock generating circuit illustrated in FIG. 1.
Figure 3:
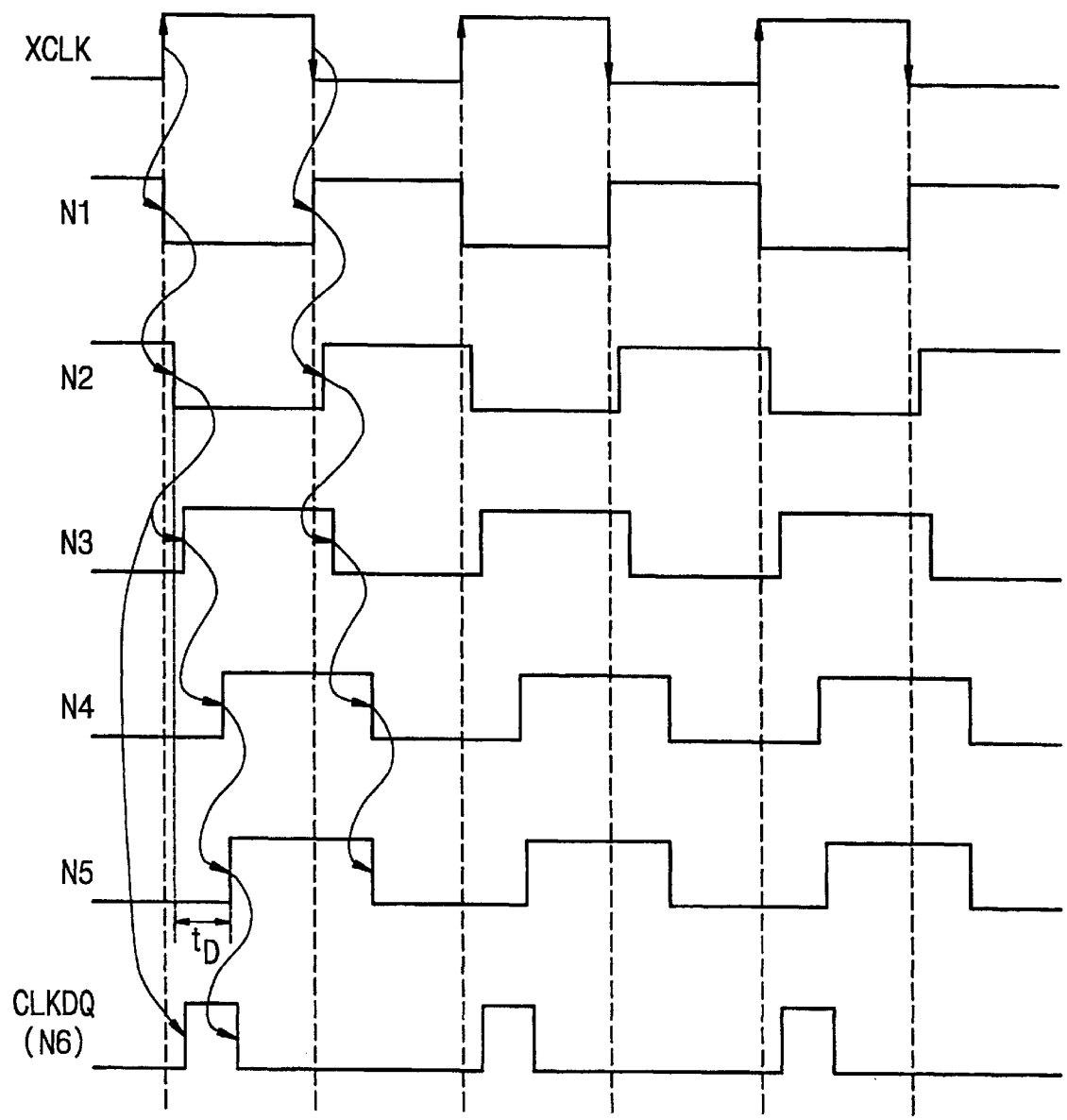
FIG. 3 is a timing diagram showing signal waveforms at various nodes in FIG. 2.

According to clock generating circuits and methods of the present invention, the activation speed of the clock signal CLKDQ can be reduced by about the delay time of the internal buffer circuit 23 of FIG. 2 as compared with a conventional clock generating circuit of FIG. 2. Moreover, although the internal buffer circuit 23 may be eliminated in the clock generating circuit 200 of FIG. 5, problems of conventional clock generating circuits need not arise. Also, since the dynamic inverter circuit 204 is maintained at the reset state (standby state), the output of the dynamic inverter circuit 204 (or the clock signal CLKDQ) need not be affected by the potential on the node N10 following the external clock signal XCLK. Therefore, the clock generating circuit 200 of the present invention can have an improved immunity against noise such as ground line bouncing.

The present invention has been described using a synchronous dynamic random access memory device as an exemplary embodiment. However, it is to be understood that the scope of the invention is not limited to the disclosed embodiment. The present invention can be implemented in a synchronous static random access memory device, a synchronous flash memory device, a synchronous ferroelectric random access memory device, a synchronous mask read-only memory device, a high-speed data processing unit such as a microprocessor unit, a logic circuit or other integrated circuit that generates internal clock signals. Also, the circuits and methods of the invention may be used to rapidly generate internal signals other than clock signals for integrated circuits, for example to rapidly convert a TTL level into a signal of a CMOS level.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   a reset circuit that is responsive to an input signal to generate a reset signal pulse a predetermined time after the input signal is activated; and
   a dynamic inversion circuit that inverts the input signal in the absence of the reset signal pulse and that assumes an inactive state in response to the reset signal pulse to thereby produce an output pulse that is activated by the input signal and that is deactivated by the reset circuit as a function of the predetermined time.

2. An integrated circuit according to claim 1 wherein the dynamic inversion circuit comprises:
   first, second and third field effect transistors, the sources and drains of which are serially connected;
   the gates of the first and third field effect transistors being responsive to the reset signal pulse; and
   the gate of the second field effect transistor being responsive to the input signal.

3. An integrated circuit according to claim 1 wherein the reset circuit comprises:
   an inverter that is responsive to the input signal;
   a delay circuit that also is responsive to the input signal to delay the input signal by the predetermined time; and
   a logic circuit that is responsive to the inverter and to the delay circuit to generate the reset signal pulse the predetermined time after the input signal is activated.

4. An integrated circuit according to claim 2 wherein the reset circuit comprises:
   an inverter that is responsive to the input signal;
   a delay circuit that also is responsive to the input signal to delay the input signal by the predetermined time; and
   a logic circuit that is responsive to the inverter and to the delay circuit to generate the reset signal pulse the predetermined time after the input signal is activated.

5. An integrated circuit according to claim 2 wherein the first and second field effect transistors are of a first conductivity type and wherein the third field effect transistor is of a second conductivity type.

6. An integrated circuit according to claim 4 wherein the delay circuit comprises an odd number of serially connected inverters.

7. An integrated circuit according to claim 6 wherein the logic circuit comprises:
   a NAND gate that is responsive to the inverter and to the odd number of serially connected inverters; and
   a second inverter that is responsive to the NAND gate to produce the reset signal pulse.

8. An integrated circuit according to claim 1 wherein the input signal is a function of an external clock signal such that the output pulse provides an internal clock pulse.

9. An integrated circuit according to claim 1 further comprising an input buffer circuit that is responsive to an external clock signal to produce the input signal.

10. An integrated circuit according to claim 9 wherein the input buffer circuit comprises a differential amplifier circuit that inverts the external clock signal to produce the input signal.

11. An integrated circuit according to claim 1 further comprising:
    a latch that is responsive to the output pulse; and
    an output driver circuit that is responsive to the latch.

12. An integrated circuit according to claim 1 further comprising:
    a memory cell array comprising a plurality of rows and columns of memory cells;
    a row decoder that selects at least one row of the memory cell array;
    a column decoder that selects at least one column of the memory cell array;
    a sense amplifier circuit that senses data that is stored in the at least one row and the at least one column that are selected; and
    a data output circuit that outputs the sensed data to external of the integrated circuit in response to the output pulse.

13. A method of operating an integrated circuit comprising the steps of:
    generating a reset signal pulse a predetermined time after an input signal is activated; and
    inverting the input signal until the reset pulse is generated to thereby produce an output pulse that is activated by the input signal and that is deactivated by the reset signal pulse as a function of the predetermined time.

14. A method according to claim 13 wherein the generating step comprises the steps of:
    inverting the input signal;
    delaying the input signal by the predetermined time; and
    combining the inverted input signal and the delayed input signal to generate the reset signal pulse the predetermined time after the input signal is activated.

15. A method according to claim 13 wherein the generating step is preceded by the step of:
    input buffering an external clock signal to produce the input signal.

16. A method according to claim 15 wherein the step of input buffering comprises the step of differentially amplifying the external clock signal to produce the input signal.

17. A method according to claim 13 further comprising the steps of:

selecting at least one row of a memory cell array;

selecting at least one column of the memory cell array;

sensing data that is stored in the at least one row and the at least one column that are selected; and outputting the sensed data to external of the integrated circuit in response to the output pulse.

18. An integrated circuit comprising:

means for generating a reset signal pulse a predetermined time after an input signal is activated; and means for inverting the input signal until the reset pulse is generated to thereby produce an output pulse that is activated by the input signal and that is deactivated by the means for generating a reset signal pulse as a function of the predetermined time.

19. An integrated circuit according to claim 18 wherein the means for generating comprises:

means for inverting the input signal;

means for delaying the input signal by the predetermined time; and means for combining the inverted input signal and the delayed input signal to generate the reset signal pulse the predetermined time after the input signal is activated.

20. An integrated circuit according to claim 18 further comprising:

means for input buffering an external clock signal to produce the input signal.

21. An integrated circuit according to claim 20 wherein the means for input buffering comprises means for differentially amplifying the external clock signal to produce the input signal.

22. An integrated circuit according to claim 18 further comprising:

a memory cell array comprising a plurality of rows and columns of memory cells;

means for selecting at least one row of a memory cell array;

means for selecting at least one column of the memory cell array;

means for sensing data that is stored in the at least one row and the at least one column that are selected; and means for outputting the sensed data to external of the integrated circuit in response to the output pulse.

23. An integrated circuit memory device comprising:

a memory cell array comprising a plurality of rows and columns of memory cells;

a row decoder that selects at least one row of the memory cell array;

a column decoder that selects at least one column of the memory cell array;

a sense amplifier that senses data that is stored in the at least one row and the at least one column that are selected;

an internal clock generating circuit that generates an internal clock pulse in response to an external clock signal; and a data output circuit that outputs the sensed data to external of the integrated circuit in response to the internal clock signal;

the internal clock generating circuit comprising a reset circuit that is responsive to the external clock signal to generate a reset signal pulse a predetermined time after the external clock signal is activated, and a dynamic inversion circuit that inverts the external clock signal in the absence of the reset signal pulse and that assumes an inactive state in response to the reset signal pulse to thereby produce an internal clock pulse that is activated by the input signal and that is deactivated by the reset circuit as a function of the predetermined time.

24. An integrated circuit memory device according to claim 23 wherein the inversion circuit comprises:

first, second and third field effect transistors, the sources and drains of which are serially connected;

the gates of the first and third field effect transistors being responsive to the reset signal pulse; and the gate of the second field effect transistor being responsive to the external clock signal.

25. An integrated circuit according to claim 23 wherein the reset circuit comprises:

an inverter that is responsive to the external clock signal;

a delay circuit that also is responsive to the external clock signal to delay the external clock signal by the predetermined time; and a logic circuit that is responsive to the inverter and to the delay circuit to generate the reset signal pulse the predetermined time after the external clock signal is activated.

26. An integrated circuit according to claim 23 further comprising an input buffer circuit that is responsive to the external clock signal, wherein the reset circuit and the inversion circuit are responsive to the buffer circuit.

27. An integrated circuit according to claim 26 wherein the input buffer circuit comprises a differential amplifier circuit that inverts the external clock signal.

* * * * *